United States Patent [19]

Murata et al.

[11] Patent Number: 4,851,658
[45] Date of Patent: Jul. 25, 1989

[54] COLOR SENSOR HAVING IMPROVED UNIFORMITY OF SENSITIVITY

[75] Inventors: Kenji Murata, Osaka; Yasuo Kishi, Hirakata, both of Japan

[73] Assignee: Sanyo Electric Co., Ltd., Moriguchi, Japan

[21] Appl. No.: 170,656

[22] Filed: Mar. 17, 1988

Related U.S. Application Data

[63] Continuation of Ser. No. 880,000, Jun. 30, 1986, abandoned.

[30] Foreign Application Priority Data

Oct. 16, 1985 [JP] Japan ................... 60-230337

[51] Int. Cl.⁴ ............................................. H01J 40/14
[52] U.S. Cl. .................. 250/211 R; 250/226; 357/30
[58] Field of Search ............... 250/211 R, 211 J, 226, 250/578; 357/30 D, 30 Q, 65, 68, 30 K

[56] References Cited

U.S. PATENT DOCUMENTS 4,395,629 7/1983 Sasano et al. ................. 250/226
4,520,381 5/1985 Moriguchi et al. ............ 250/226
4,532,537 7/1985 Kane .......................... 250/211 J
4,599,482 7/1986 Yamazaki ..................... 357/30 K

FOREIGN PATENT DOCUMENTS 2115980 1/1983 United Kingdom .

*Primary Examiner*—Edward P. Westin
*Assistant Examiner*—Khaled Shami
*Attorney, Agent, or Firm*—W. G. Fasse; D. H. Kane, Jr.

[57] ABSTRACT

A color sensor produced in accordance with the present invention comprises a colorless and transparent substrate; at least one color filter disposed on a main surface of the substrate; a colorless and transparent front electrode layer of transparent conductive oxides (TCO) formed on the opposite main surface of the substrate, corresponding to each of the filters; a semiconductor layer formed on the front electrode layer, wherein the interface between the front electrode layer and semiconductor layer is roughened to have a periodic unevenness thereby to decrease the reflectance of visible incident light at the interface; and a back electrode layer formed on the semiconductor layer.

25 Claims, 6 Drawing Sheets

2000Å

3300Å

|—•—|
2000Å

|—•—|
3300Å

|—————|
2000Å

|——|
3300Å

COLOR SENSOR HAVING IMPROVED UNIFORMITY OF SENSITIVITY

This application is a continuation, of application Ser. No. 880,000, filed June 30, 1986, now abandoned.

BACKGROUND OF THE INVENTION

1. Field of the Invention

This invention relates to a color sensor having at least one color filter, and more particularly to improvements in the sensitivity of the color sensors and minimization of variation of the spectral sensitivity within single sensors and among these sensors.

2. Description of the Prior Art

A prior art color sensor is disclosed, for example, in U.K. Pat. No. 2,115,980. In such a color sensor, color filters for selectively transmitting their respective monochromatic lights such as red, green, blue, etc. with the respective local wave length ranges are disposed on a main surface of a colorless and transparent insulator substrate such as a glass plate. To detect light transmitted through each of the color filters, a transparent front electrode layer, a semiconductor layer for photoelectric effect and a back electrode layer are stacked in order on the opposite main surface of the transparent substrate, corresponding to each of the filters. Generally, the front electrode comprises a single layer or stack of layers of transparent conductive oxides (TCO) such as indium tin oxide (ITO) and tin oxide ($SnO_x$), and may be deposited by a vacuum evaporation method, an electron beam evaporation method, a sputtering method, a CVD method, a spray method or the like.

The refractive index of such a TCO layer is generally about 2.0, while the index of a semiconductor layer which is to be formed on the TCO layer is generally much larger than 2.0. For example, the index is about 4.0 for amorphous silicon derivatives such as amorphous silicon, amorphous silicon carbide and amorphous silicon germanium. Therefore, incoming light is partly reflected due to the difference in the refractive index at the interface between the front electrode layer and the semiconductor layer, and thus the quantity of light entering the semiconductor layer for photoelectric effect is decreased. Further, since the reflectance of the incident light at the interface changes depending on the thickness of the front electrode layer, the sensitivity of the color sensor is also influenced by the thickness and accordingly the sensitivity varies greatly among the sensors.

SUMMARY OF THE INVENTION

It is a major object of the present invention to minimize the variation scattering of the spectral sensitivity within single color sensors and among individual color sensors by minimizing the influence of the thickness of the front electrode layer on the reflectance of the incident light at the interface between the front electrode layer and the semiconductor layer. In other words, the spectral sensitivity of an individual color sensor and of a plurality of color sensors shall be more uniform than was possible heretofore.

It is another object of the present invention to improve the sensitivity of the color sensor by decreasing the reflectance of the incident light to less than 20%.

A color sensor in accordance with the present invention comprises a colorless and transparent substrate; at least one color filter disposed on a main surface of the substrate; a colorless and transparent front electrode layer of TCO formed on the opposite main surface of the substrate, corresponding to each of the filters; a semiconductor layer formed on the front electrode layer, wherein the interface between the front electrode layer and semiconductor layer is roughened to have a periodic unevenness thereby decreasing the reflectance of visible incident light at the interface; and a back electrode layer formed on the semiconductor layer.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
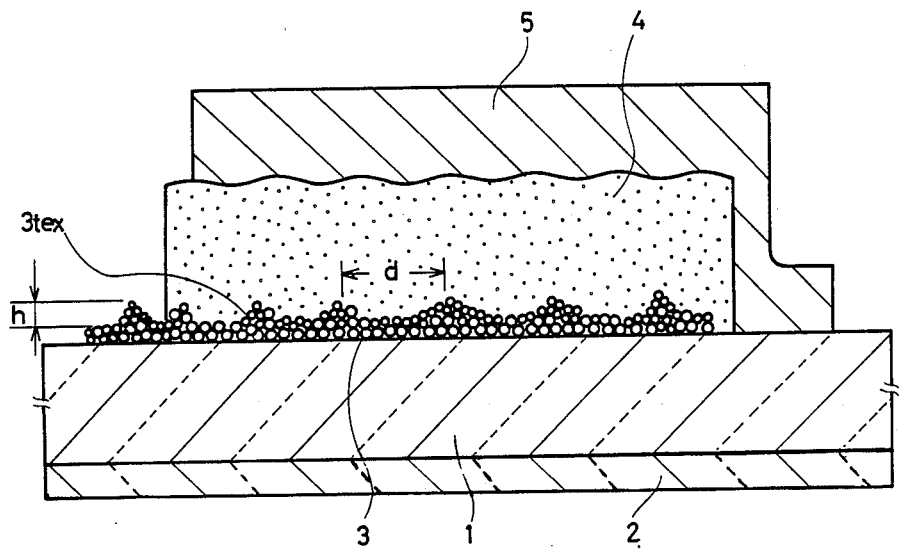
FIG. 1 is a schematic sectional view of a color sensor according to an embodiment of the present invention.

Referring to FIG. 1, there is shown a schematic sectional view of a color sensor in accordance with the present invention, which detects a particular visible monochromatic light in the wave length range of about 350–800 nm. Disposed on a main surface of a colorless and transparent substrate 1 such as a glass plate is a color filter 2 for selectively transmitting a particular monochromatic light to be detected. A colorless and transparent front electrode layer 3 of TCO is formed on the opposite main surface of the substrate 1. A semiconductor layer 4 which may comprise at least one amorphous silicon derivative sensitive to visible light is formed on the front electrode layer 3. The semiconductor layer 4 thus formed is activated by the particular monochromatic light transmitted through the filter 2 and then causes a photovoltaic or photoconductive effect. A back electrode 5 is formed on the semiconductor layer 4, making ohmic contact therebetween. The front electrode 3 and the back electrode 5 conduct the photoelectric output of the semiconductor layer 4.

When the semiconductor layer 4 is of a photovoltaic type, it includes a p-n or p-i-n junction parallel to its wide surface. Alternatively, when the semiconductor layer 4 is of a photoconductive type, it does not include such a fundamental junction and comprises an intrinsic (i-type) semiconductor or a slightly doped semiconductor of one conductivity type. The semiconductor layer 4 includes a highly doped interfacial layer neighboring with the back electrode layer 5 thereby making ohmic contact therebetween.

A major feature of the present invention resides in the use of the colorless transparent front electrode 3 with which the reflection of the incident light due to the difference in the refractive index at the interface between the front electrode layer 3 and semiconductor layer 4 can be decreased drastically regardless of the thickness of the front electrode layer 3. The interface 3tex between the front electrode layer 3 and semiconductor layer 4 is roughened to have an unevenness "h" of about 1000-5000Å in height with a periodicity "d" of about 2000-10,000Å.

Figure 2A:
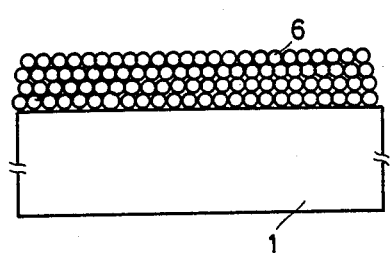
FIGS. 2A, 2B and 2C are schematic sectional views illustrating an etching process of a TCO layer in accordance with the present invention.
Figure 2B:
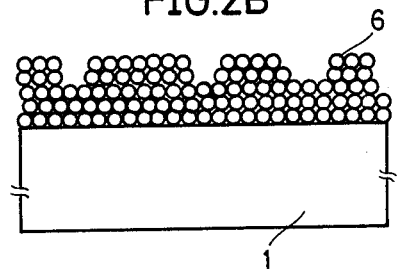
Figure 2C:
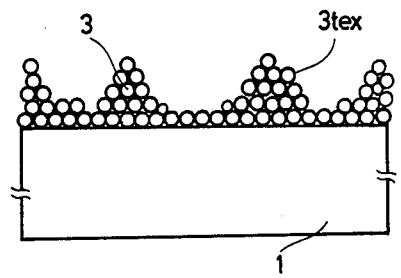

FIGS. 2A, 2B and 2C schematically illustrate a method for processing a TCO layer in accordance with the present invention. First, a TCO layer 6 is formed uniformly on a substantially flat surface of a transparent insulator substrate 1 such as a glass plate, as shown in FIG. 2A. The TCO layer 6 may be deposited by a vacuum evaporation method, an electron beam evaporation method, a sputtering method, a CVD method, a spray method or the like, and comprises ITO or SnOx. More specifically, a TCO layer 6 of ITO doped with 5 wt. % $SnO_x$ may be deposited on a substrate 1 up to about 1500-7000Å in thickness with a mean TCO particle size of about 500-2000Å by an electron beam evaporation method under conditions of a substrate temperature of 300° C. and an oxygen partial pressure of $4\times10^{-4}$ Torr.

FIG. 2B, the surface of the TCO layer 6 is etched in order to make it rough. An etchant of concentrated HCl : $H_2O$ : $FeCl_3$ in a ratio of 500 cc : 600 cc : 100 g is preferable for the TCO layer of ITO, and aqua regia may also be used. The etching starts and progresses dominantly at points on the TCO layer where the etching rate is higher due to the anisotropy of the etching rate, and then makes a lot of small dimples on the surface of the TCO layer as shown in FIG. 2B.

FIG. 2C shows the final state of the TCO layer after the etching treatment. Namely, the etching is developed until the TCO layer has an uneven surface 3tex suitable for the front electrode 3, and then the etching is stopped halfway in the direction of the thickness. For example, such an uneven surface 3tex can be obtained by etching at about 25° C. for 20-40 min. with the above described etchant, and shows an unevenness of about 1000-5000Å with an periodicity of about 2000-10,000Å.

Figure 3A:
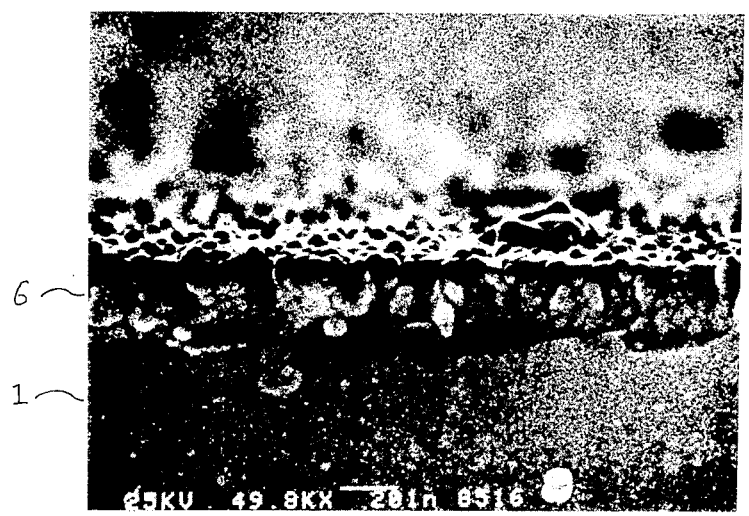
FIGS. 3A and 3B are scanning electron micrographs, respectively showing the sectional structure and the surface texture of a TCO layer in the state of FIG. 2A.
Figure 3B:
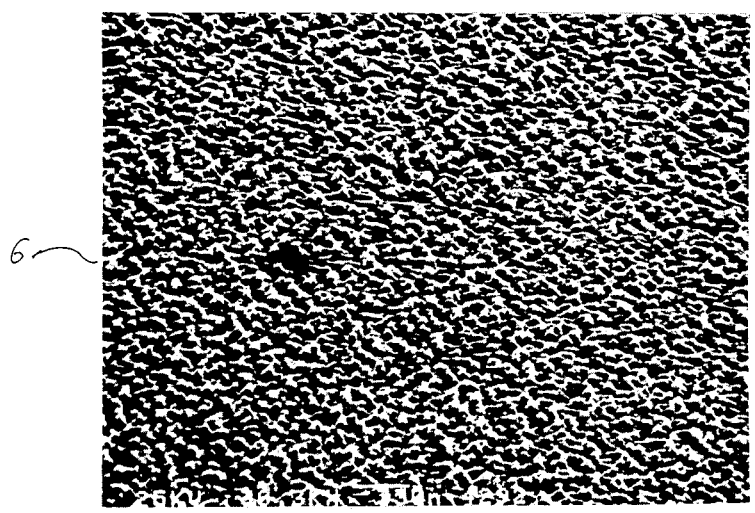

FIGS. 3A and 3B are scanning electron micrographs with scales thereunder, showing the particle structure of a TCO layer in the state of FIG. 2A before the etching treatment. It is noted from the scales that the magnification is different between those micrographs. FIG. 3A shows the sectional structure of the TCO layer 6, and FIG. 3B shows the surface texture viewed from an oblique angle of 80°.

Figure 4A:
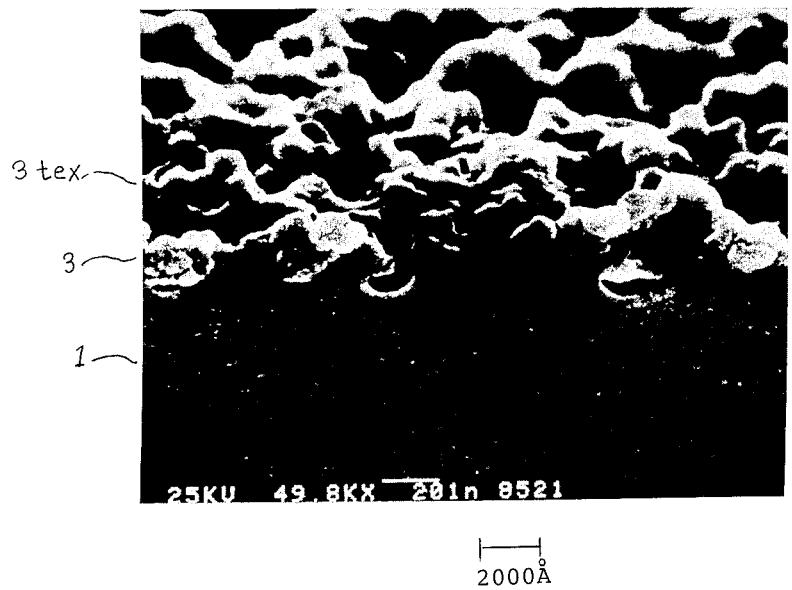
FIGS. 4A and 4B are micrographs, respectively showing the sectional structure and the surface texture of the TCO layer in the state of FIG. 2B.
Figure 4B:
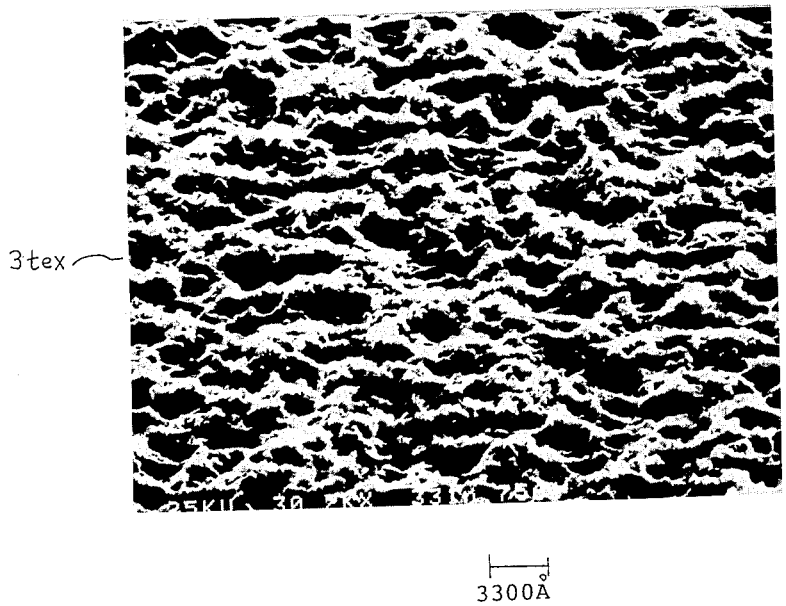

Similarly, FIGS. 4A and 4B are micrographs, respectively showing the sectional structure and the surface texture of the TCO layer 6 at such an intermediate stage of the etching treatment as in FIG. 2B.

Figure 5A:
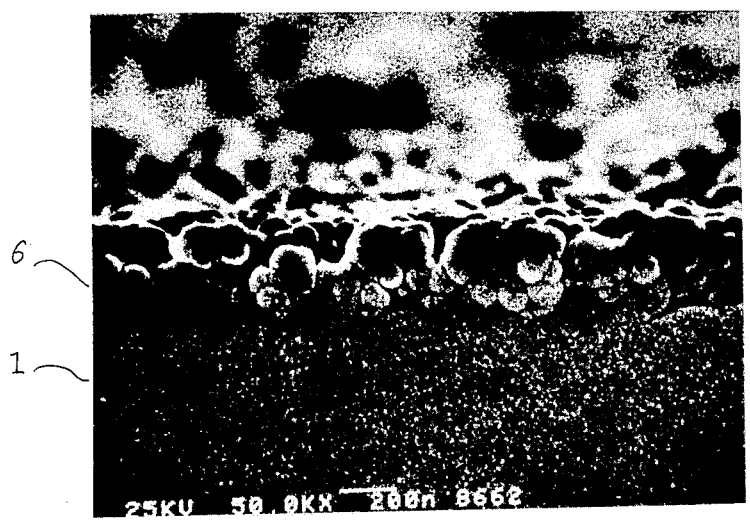
FIGS. 5A and 5B are micrographs, respectively showing the sectional structure and the surface texture of the TCO layer in the state of FIG. 2C.
Figure 5B:
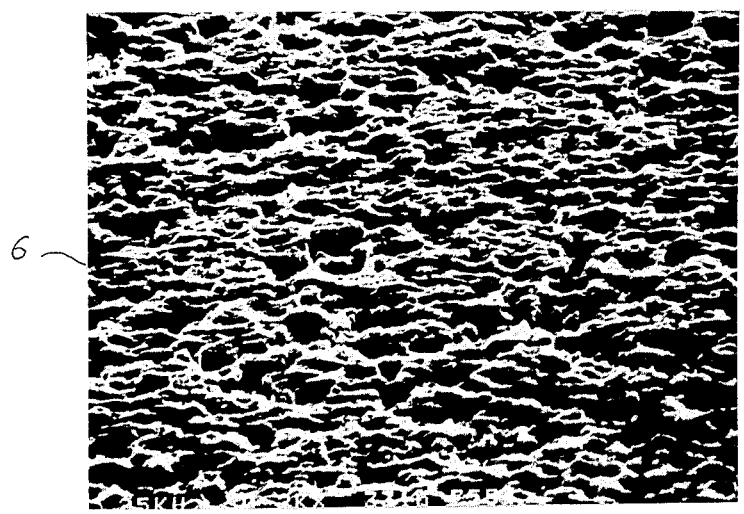

Further similarly, FIGS. 5A and 5B are micrographs, respectively showing the sectional structure and the surface texture of the TCO layer 3 in the state of FIG. 2C after the etching treatment.

It is clearly seen from these micrographs of FIG. 3A to FIG. 5B that an uneven surface 3tex of the TCO layer 3 can be readily formed due to the anisotropy of the etching rate without uniformly etching and removing the surface layer.

To evaluate a color sensor into which the front electrode layer 3 of TCO provided with such an uneven surface 3tex is incorporated, the semiconductor layer 4 of such an amorphous silicon layer having a p-i-n junction as described in the above U.K. Pat. No. 2,115,980 and the back electrode layer 5 are stacked in order on the uneven surface 3tex, and then the reflection characteristics of the sensor without the color filter 2 is measured for the entire wave length range of visible light.

Figure 6:
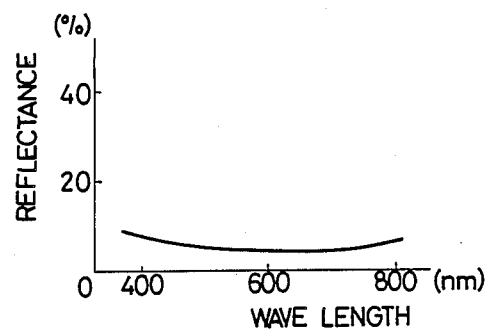
FIG. 6 is a graph showing the reflection characteristics in a color sensor of the present invention with the color filter of the sensor removed.

FIG. 6 is a graph showing the reflection characteristics thus measured in the sensor. In a sensor utilizing the front electrode 3 with an uneven surface in accordance with the present invention, the reflectance is substantially constant and less than 10% for the entire range of visible light, i.e., for wave lengths of about 350-800 nm.

Figure 7:
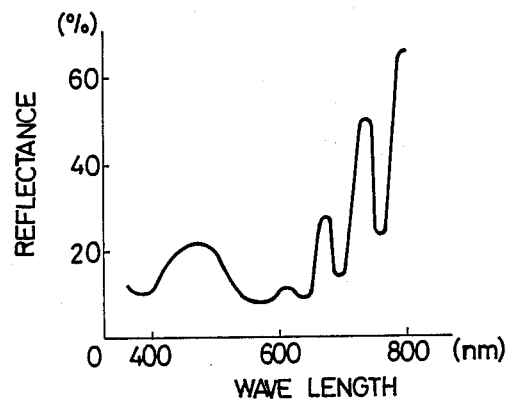
FIG. 7 is a graph similarly showing the reflection characteristics in a conventional color sensor.

For comparison, FIG. 7 shows the reflection characteristics in a sensor which has a TCO layer 6 with an even surface as shown in FIG. 2A for its front electrode. The reflectance of this sensor varies largely depending on the light wave length and becomes more than 20% in particular local ranges of the wave length. In particular, the reflectance is greater than 50% in the wave length range of the color red.

The spectral sensitivity of the color sensor, which is also influenced by the thickness of the TCO front electrode layer, was evaluated by measuring the short-circuit output current. A red filter was selected as the color filter 2, which transmits red light of a wave length of about 700 nm wherein the reflectance is largely influenced by the thickness of the TCO electrode layer. One hundred samples each were prepared of both the present color sensor and a conventional one, and then the frequency distribution was measured with respect to the short-circuit output current.

Figure 8:
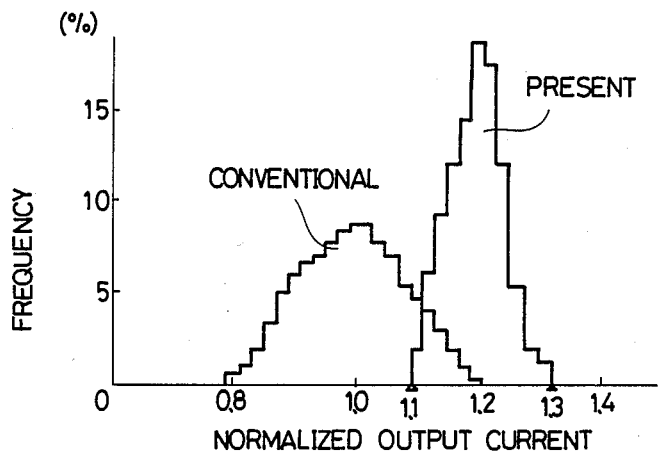
FIG. 8 is a histogram showing the frequency distribution of samples for the present sensor with its red filter and the conventional one with the same filter, with respect to the short-circuit output current.

FIG. 8 is a histogram showing the frequency distribution thus measured. In this histogram, the short-circuit output current of the horizontal axis is normalized by the mean value of the output current in of the conventional color sensors. It is seen from FIG. 8 that the normalized output current varies from 0.8 to 1.2 among the conventional color sensors, while it varies only from 1.1 to 1.3 among the color sensors according to the present invention. Namely, it is understood that variation of the spectral sensitivity among the present color sensors is reduced to half of that among the conventional sensors. This suggests that the thickness of the TCO electrode influences the refelctance much less in the present color sensors than in conventional color sensors. Further, the output current of the present color sensor is improved, i.e., in the sensitivity by 20% due to the low reflectance.

Figure 9:
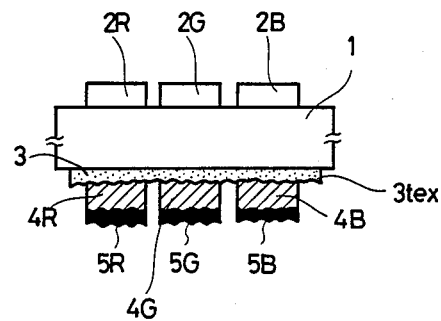
FIG. 9 is a schematic sectional view of a color sensor according to another embodiment of the present invention.

Referring to FIG. 9, there is shown another embodiment of the present invention. A color sensor of this embodiment has a red filter 2R, a green filter 2G and a blue filter 2B which are disposed on a main surface of a colorless and transparent substrate 1. A TCO front electrode layer 3 is formed on the opposite main surface of the substrate 1. Semiconductor layers 4R, 4G and 4B which are isolated from one another are formed on the front electrode layer 3, respectively corresponding to the color filters 2R, 2G and 2B. Back electrode layers 5R, 5G and 5B are formed on the respective semiconductor layers 4R, 4G and 4B. The interface 3tex between the front electrode layer 3 and each of the semiconductor layers 4R, 4G and 4B is roughened to have an unevenness of about 1000–5000Å in height with a periodicity of about 2000–10,000Å.

This color sensor of the invention shows a high and stable spectral sensitivity regardless of the light wave length, because it has a reflectance of less than 10% in the entire wave length range of visible light and is much less influenced by the thickness of the front electrode layer.

Since the semiconductor layer is formed directly on the TCO front electrode in the above described embodiments, it may be possible that indium in the TCO electrode diffuses into the semiconductor layer and then deteriorates the characteristics of the semiconductor layer. Therefore, it is preferable to interpose a thin $SnO_x$ layer of about 200–300Å thickness between the TCO front electrode and the semiconductor layer. Such a thin intervening $SnO_x$ layer does not affect the reflectance of the color sensor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A color sensor for detecting incident light comprising a colorless and transparent substrate; a color filter disposed on a main surface of said substrate; a colorless and transparent front electrode layer of a transparent conductive oxide (TCO) layer formed on the opposite mains surface of said substrate; a semi-conductor layer for a photoelectric effect formed on said front electrode layer, wherein an interface between said front electrode layer and said semiconductor layer is roughened to have an unevenness in height (h) with such a periodicity that the reflectance of said incident light at said interface is stable irrespective of the thickness of said front electrode layer in a wave length range selected by said color filter whereby the color sensitivity is also stable and uniform in said wave length range; and a back electrode layer formed on said semiconductor layer.

2. The color sensor of claim 1, wherein said uneven interface is produced by etching the surface of said TCO layer before the formation of said semiconductor layer.

3. The color sensor of claim 2, wherein said TCO layer comprises indium tin oxide.

4. The color sensor of claim 3, wherein said TCO layer is doped with 5 wt. % $SnO_x$.

5. The color sensor of claim 2, wherein said TCO layer comprises aggregated small particles with a mean particle size of about 500–2000Å.

6. The color sensor of claim 3, wherein said surface of said TCO layer is etched with an etchant of concentrated $HCL : H_2O : FCl_3$ in a ratio of: 500 cc : 600 cc: 100 g.

7. The color sensor of claim 3, wherein said surface of said TCO layer is etched with aqua regia.

8. The color sensor of claim 1, wherein the reflectance of the incident light at said interface is less than 20%.

9. The color sensor of claim 8, wherein the reflectance of the incident light at said interface is less than 10%.

10. The color sensor of claim 1, wherein said interface has an unevenness of about 1000–5000Å in height with a periodicity of about 2000–10,000Å.

11. A color sensor for detecting incident light comprising a colorless and transparent substrate; a plurality of color filters disposed on a main surface of said substrate, which transmit their respective monochromatic lights; a colorless and transparent front electrode layer comprising a TCO layer formed on the opposite main surface of said substrate; a plurality of semiconductor layers for photoelectric effect formed on said front electrode layer and isolated from one another in regions corresponding to said color filters, wherein the interface between said front electrode layer and each of said semiconductor layers is roughened to have an unevenness in height (h) with such a periodicity that the reflectance of said incident light at said interface is stable irrespective of the thickness of said front electrode layer in a wave length range selected by said color filter whereby the color sensitivity is also stable in said wavelength range; and a back electrode formed on each of said semiconductor layers.

12. The color sensor of claim 11, wherein said uneven interface is produced by etching the surface of said TCO layer before the formation of said semiconductor layers.

13. The color sensor of claim 12, wherein said TCO layer comprises indium tin oxide.

14. The color sensor of claim 13, wherein said TCO layer is doped with 5 wt. % $SnO_x$.

15. The color sensor of claim 12, wherein said TCO layer comprises aggregated small particles with a mean particle size of about 500–2000Å.

16. The color sensor of claim 13, wherein said surface of said TCO layer is etched with an etchant of concentrated $HCl : H_2O : FCl_3$ in a ratio of: 500 cc : 600 cc : 100 g.

17. The color sensor of claim 13, wherein said surface of said TCO layer is etched with aqua regia.

18. The color sensor of claim 11, wherein the reflectance of the incident light at said interface is less than 20%.

19. The color sensor of claim 18, wherein the reflectance of the incident light at said interface is less than 10%.

20. The color sensor of claim 11, wherein said interface has an unevenness of about 1000–5000Å in height with a periodicity of about 2000–10,000Å.

21. The color sensor of claim 1, wherein said reflectance of said incident light transmitted through said color filter is substantially constant and decreased to less than about twenty percent for the range of wavelengths from 350 to 800 nm, and wherein said color sensor has a normalized output current within the range of 1.1 to 1.3.

22. The color sensor of claim 1, wherein said color filter means comprise a plurality of color filter elements disposed on said substrate, wherein said front electrode, said interface, and said semiconductor layer are continuous layers, and wherein said back electrode comprises a plurality of back electrode elements.

23. The color sensor of claim 1, wherein said color filter means comprise a plurality of color filter elements disposed on said substrate, wherein said front electrode and said interface each comprise a plurality of respective elements, and wherein said semiconductor layer and said back electrode are continuous layers.

24. The color sensor of claim 1, wherein said color filter means comprise a plurality of color filter elements disposed on said substrate, wherein said front electrode, said interface, and said back electrode each comprises a plurality of respective elements, and wherein said semiconductor is a continuous layer.

25. The color sensor of claim 1, wherein said color filter means comprise a plurality of color filter elements disposed on said substrate, wherein said front electrode, said interface, said semiconductor layer, and said back electrode each comprises a plurality of respective elements.

* * * * *